(12) United States Patent
Cho et al.

(10) Patent No.: US 10,386,042 B2
(45) Date of Patent: Aug. 20, 2019

(54) WAVELENGTH CONVERSION MEMBER, METHOD OF MANUFACTURING THE SAME, AND BACKLIGHT ASSEMBLY INCLUDING THE SAME

(71) Applicant: Samsung Display Co., Ltd., Yongin-si, Gyeonggi-do (KR)

(72) Inventors: Joo Woan Cho, Seongnam-si (KR); Byung Choon Yang, Seoul (KR)

(73) Assignee: Samsung Display Co., Ltd., Yongin-si (KP)

( * ) Notice: Subject to any disclaimer, the term of this patent is extended or adjusted under 35 U.S.C. 154(b) by 71 days.

(21) Appl. No.: 15/410,600

(22) Filed: Jan. 19, 2017

(65) Prior Publication Data

US 2017/0130933 A1 May 11, 2017

Related U.S. Application Data

(62) Division of application No. 14/315,038, filed on Jun. 25, 2014, now Pat. No. 9,568,664.

(30) Foreign Application Priority Data

Feb. 5, 2014 (KR) .................. 10-2014-0013100

(51) Int. Cl.
| | | |
|---|---|---|
| *F21V 9/30* | (2018.01) | |
| *F21V 8/00* | (2006.01) | |
| *G02F 1/35* | (2006.01) | |
| *C23C 14/58* | (2006.01) | |
| *G02B 5/02* | (2006.01) | |
| *G02F 1/355* | (2006.01) | |
| *G02F 1/017* | (2006.01) | |

(52) U.S. Cl.
CPC ............ *F21V 9/30* (2018.02); *C23C 14/5813* (2013.01); *G02B 5/0242* (2013.01); *G02B 6/0023* (2013.01); *G02B 6/0025* (2013.01); *G02B 6/0026* (2013.01); *G02B 6/0065* (2013.01); *G02F 1/353* (2013.01); *G02F 1/3556* (2013.01); *G02F 2001/01791* (2013.01)

(58) Field of Classification Search
CPC .............................. F21V 9/30; C23C 14/5813
See application file for complete search history.

(56) References Cited

U.S. PATENT DOCUMENTS

| | | |
|---|---|---|
| 7,819,539 B2 | 10/2010 | Kim et al. |
| 8,757,862 B2 | 6/2014 | Lee |
| 8,783,930 B2 | 7/2014 | Park et al. |
| 9,207,380 B2 | 12/2015 | Um |

(Continued)

FOREIGN PATENT DOCUMENTS

| | | |
|---|---|---|
| KR | 10-2011-0118119 A | 10/2011 |
| KR | 10-2012-0061539 A | 6/2012 |

(Continued)

*Primary Examiner* — Robert A Vetere
(74) *Attorney, Agent, or Firm* — Lewis Roca Rothgerber Christie LLP

(57) ABSTRACT

A wavelength conversion member is disclosed. In one aspect, the wavelength conversion member includes a first substrate, a second substrate formed over the first substrate, and a wavelength conversion layer interposed between the first and second substrates. A sealant is interposed between the first and second substrates and surrounds the wavelength conversion layer.

13 Claims, 18 Drawing Sheets

(56) References Cited

U.S. PATENT DOCUMENTS

| | | | |
|---|---|---|---|
| 2003/0162463 A1* | 8/2003 | Hayashi | H01L 21/6835 445/24 |
| 2004/0140762 A1* | 7/2004 | Tohma | H01L 27/322 313/506 |
| 2005/0057708 A1* | 3/2005 | Kuo | G02F 1/133514 349/106 |
| 2005/0062898 A1* | 3/2005 | Imayama | G02F 1/133345 349/43 |
| 2006/0004140 A1* | 1/2006 | Asano | C08F 283/10 525/31 |
| 2007/0097336 A1* | 5/2007 | Sakurai | G02F 1/167 353/97 |
| 2008/0225097 A1* | 9/2008 | Takiguchi | B41J 2/14233 347/100 |
| 2008/0316165 A1* | 12/2008 | Kim | G09G 3/3406 345/102 |
| 2009/0153942 A1* | 6/2009 | Daniel | G02F 1/167 359/296 |
| 2011/0121732 A1 | 5/2011 | Tsutsumi | |
| 2011/0141769 A1 | 6/2011 | Lee et al. | |
| 2012/0051075 A1 | 3/2012 | Harada et al. | |
| 2013/0148376 A1 | 6/2013 | Nick et al. | |
| 2014/0111968 A1 | 4/2014 | Lee | |
| 2014/0234999 A1* | 8/2014 | Kim | C09K 11/02 438/26 |
| 2014/0268877 A1 | 9/2014 | Yang et al. | |
| 2015/0049491 A1* | 2/2015 | Venkataraman | H01L 33/00 362/318 |

FOREIGN PATENT DOCUMENTS

| | | |
|---|---|---|
| KR | 10-2012-0066322 A | 6/2012 |
| KR | 10-1251807 B1 | 4/2013 |
| KR | 10-2013-0064653 A | 6/2013 |

* cited by examiner

WAVELENGTH CONVERSION MEMBER, METHOD OF MANUFACTURING THE SAME, AND BACKLIGHT ASSEMBLY INCLUDING THE SAME

PRIORITY APPLICATIONS

This application is a divisional of application Ser. No. 14/315,038, filed Jun. 25, 2014, which claims priority from Korean Patent Application No. 10-2014-0013100 filed on Feb. 5, 2014 in the Korean Intellectual Property Office, the disclosures of which are incorporated herein by reference in their entirety.

BACKGROUND

Field

The described technology generally relates to a wavelength conversion member, a method of manufacturing the same, and a backlight assembly including the same.

Description of the Related Technology

Display devices are devices that visually display data. Example display devices include liquid crystal displays (LCDs), electrophoretic displays (EPDs), organic light-emitting diode (OLED) displays, inorganic electroluminescent (EL) displays, field emission displays (FEDs), surface-conduction electron-emitter displays (SEDs), plasma display panels (PDPs), and cathode ray tube (CRT) displays.

LCDs includes a liquid crystal layer interposed between two transparent substrates and display desired images by controlling the light transmittance of each pixel via an electric current applied to the liquid crystal layer.

Since liquid crystals of LCDs are not self-emissive, LCDs include a backlight assembly that provides light to the liquid crystal layer. The backlight assembly typically includes a light source unit, a light guide plate (LGP), a diffusion plate, a reflective plate, and various optical sheets.

SUMMARY OF CERTAIN INVENTIVE ASPECTS

One inventive aspect is a thin wavelength conversion member which can be manufactured by a simple process.

Another aspect is a method of manufacturing a wavelength conversion member in large quantities using a simple process and at a reduced cost.

Another aspect is a backlight assembly including a thin wavelength conversion member which can be manufactured by a simple process.

Another aspect is a wavelength conversion member comprising a first substrate, a second substrate located on the first substrate, a wavelength conversion layer interposed between the first substrate and the second substrate, and a sealant interposed between the first substrate and the second substrate and surrounding the wavelength conversion layer.

The wavelength conversion layer may comprise quantum dots.

The wavelength conversion layer may further comprise a first resin mixed with the quantum dots.

The wavelength conversion layer may have a thickness of about 80 μm to about 100 μm.

The wavelength conversion layer may further comprise an inert gas mixed with the quantum dots.

The wavelength conversion layer may have a thickness of about 10 μm to about 20 μm.

The sealant may comprise a mixture of fine particles and a second resin.

The fine particles may be formed of the same material as the first substrate or the second substrate.

The wavelength conversion member may further comprise a light blocking layer located on edges of at least one of the first substrate and the second substrate.

The wavelength conversion member may further comprise a reflection preventing layer or a light transmission adjusting layer located on at least one of the first substrate and the second substrate.

A surface of the first substrate which faces the second substrate may comprise a curved side.

Another aspect is a method of manufacturing a wavelength conversion member, the method comprising forming a wavelength conversion layer and a bank, which surrounds the wavelength conversion layer, on a first substrate, placing a second substrate on the wavelength conversion layer and the bank, and sintering the bank.

The wavelength conversion layer may comprise quantum dots.

The forming of the wavelength conversion layer and the bank may comprise forming the bank on edges of the first substrate and forming the wavelength conversion layer on a region surrounded by the bank.

The wavelength conversion layer and the bank may be formed by a printing process or a coating process.

The sintering of the bank may comprise converting the bank into a sealant by irradiating a laser beam to the bank.

Another aspect is a backlight assembly comprising a light source unit emitting light and a wavelength conversion member located on the light source unit and converting the wavelength of light emitted from the light source unit, wherein the wavelength conversion member comprises a first substrate located on the light source unit, a second substrate located on the first substrate, a wavelength conversion layer interposed between the first substrate and the second substrate, and a sealant interposed between the first substrate and the second substrate and surrounding the wavelength conversion layer.

The wavelength conversion layer may comprise quantum dots.

The backlight assembly may further comprise a light guide plate (LGP) located on the wavelength conversion member, wherein the wavelength conversion member is fixed to the LGP by an adhesive or a fixing device.

The light source unit may emit blue light and the wavelength conversion member may convert the blue light into white light.

Another aspect is a wavelength conversion member for a display device, comprising a first substrate, a second substrate formed over the first substrate, a wavelength conversion layer interposed between the first and second substrates, and a sealant interposed between the first and second substrates and surrounding the wavelength conversion layer.

The wavelength conversion layer can comprise quantum dots. The wavelength conversion layer can further comprise a first resin with the quantum dots dispersed therein. The wavelength conversion layer can have a thickness of about 80 μm to about 100 μm. The wavelength conversion layer can further comprise an inert gas mixed with the quantum dots. The wavelength conversion layer can have a thickness of about 10 μm to about 20 μm. The sealant can comprise a mixture of fine particles and a second resin. The fine particles can be formed of the same material as at least one of the first and second substrates. The wavelength conversion member can further comprise a light blocking layer formed along edges of at least one of the first and second substrates. The wavelength conversion member can further comprise a reflection preventing layer or a light transmission adjusting layer formed on at least one of the first substrate and the second substrate. Each of the first and second substrates can have a substantially C-shape.

Another aspect is a method of manufacturing a wavelength conversion member for a display device, the method comprising providing a first substrate, forming a wavelength conversion layer and a bank over the first substrate, wherein the bank surrounds the wavelength conversion layer, placing a second substrate over the wavelength conversion layer and the bank, and sintering the bank.

The wavelength conversion layer can comprise a plurality of quantum dots. The forming can comprise forming the bank along edges of the first substrate and forming the wavelength conversion layer on a region of the first substrate defined by the bank. The wavelength conversion layer and the bank can be formed by a printing process or a coating process. The sintering can comprise irradiating a laser beam onto the bank.

Another aspect is a display device, comprising a display panel and a backlight assembly including a light source configured to emit light and a wavelength converter located adjacent to the light source and configured to convert the wavelength of at least a portion the light emitted from the light source to another wavelength, wherein the wavelength converter comprises a first substrate located adjacent to the light source, a second substrate formed over the first substrate, a wavelength conversion layer interposed between the first and second substrates, and a sealant interposed between the first and second substrates and surrounding the wavelength conversion layer.

The wavelength conversion layer can comprise a plurality of quantum dots. The display device can further comprise a light guide plate (LGP) located adjacent to the wavelength converter, wherein the wavelength converter is fixed to the LGP via an adhesive or a fixing device. The light source can be configured to emit blue light and wherein the wavelength converter is configured to convert the blue light into white light.

DETAILED DESCRIPTION OF CERTAIN INVENTIVE EMBODIMENTS

Figure 1:
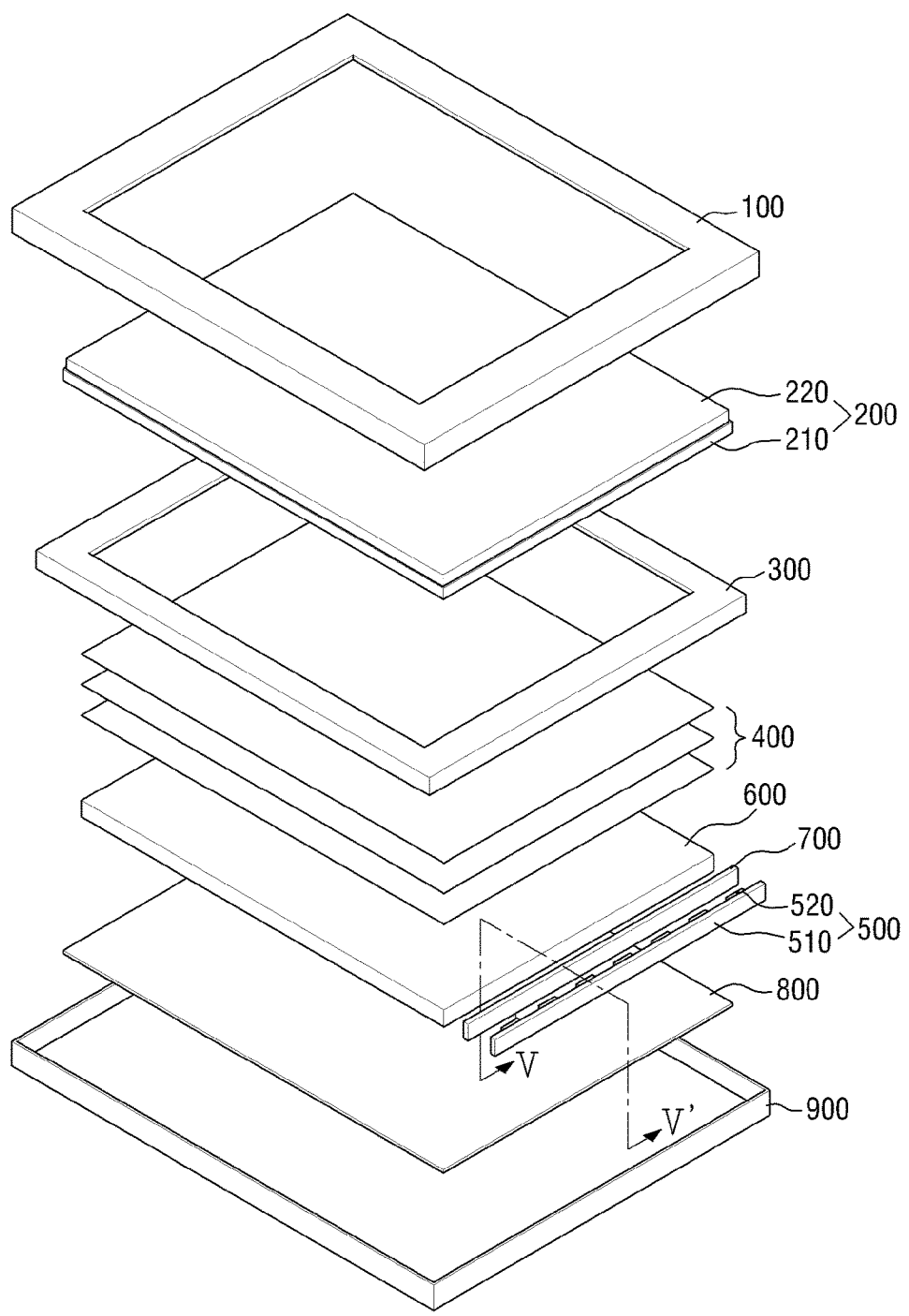
FIG. 1 is an exploded perspective view of a display device according to an embodiment.

The standard light source unit used in a backlight assembly includes a light source which emits blue light and a wavelength conversion material (e.g., a phosphor) which is located on the light source unit and converts the blue light into white light. Accordingly, the light source unit provides white light to the light guide plate (LGP) or the diffusion plate.

However, if the wavelength conversion material is located adjacent to the light source unit, its properties can be degraded by, for example, light emitted from the light source or heat generated by the light source unit. The wavelength conversion material may therefore be separated from the light source unit. To prevent this degradation, a wavelength conversion member including the wavelength conversion material may be placed on the LGP or the diffusion plate.

The wavelength conversion member can be manufactured using various methods. For example, a glass tube can be filled with a wavelength conversion material and then the glass tube can be sealed using a torch. When this method is used, a margin of approximately 10 mm should be provided in a sealing area in order to prevent degradation of the wavelength conversion material due to the heat generated by the sealing torch. However, this margin limits reductions in the dimensions of the display device, for example, to the thickness of a bezel of the display device.

The aspects and features of the described technology and methods for achieving the same will be apparent by referring to the embodiments to be described in detail with reference to the accompanying drawings. However, the described technology is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the described technology, and the described technology is only defined within the scope of the appended claims.

The term "on" is used herein to designate that an element is on another element or a layer and includes both when the element is directly on the other element or layer and when the element is on other element or layer via an additional layer or element. Throughout the description of the described technology, the same reference numerals are used to designate the same elements across various figures.

Although the terms "first," "second," and so forth are used to describe different constituent elements, these elements are not limited by the terms. The terms are used only to distinguish one element from other elements. Accordingly, in the following description, a first constituent element may be termed a second constituent element without departing from the teachings of the described technology. The term "substantially" as used in this disclosure can include the meanings of completely, almost completely, or to any significant degree in some applications and in accordance with the understanding of those skilled in the art.

Hereinafter, embodiments of the describe technology will be described with reference to the attached drawings.

FIG. 1 is an exploded perspective view of a display device according to an embodiment. Referring to FIG. 1, the display device includes a display panel 200, a backlight assembly, a top chassis 100, and a bottom chassis 900.

The display panel 200 is a panel that displays images. The display panel 200 may be a liquid crystal display (LCD) panel, an electrophoretic display (EPD) panel, an organic light-emitting diode (OLED) panel, a light-emitting diode (LED) panel, an inorganic electroluminescent (EL) display panel, a field emission display (FED) panel, a surface-conduction electron-emitter (SED) display panel, a plasma display panel (PDP), or a cathode ray tube (CRT) display panel. Hereinafter, an LCD panel will be described as an exemplary embodiment. However, the display device and the display panel 200 are not limited thereto and various display devices and display panels can be used.

The display panel 200 includes a display area where images are displayed and a non-display area where images are not displayed. In addition, the display panel 200 includes a first display substrate 210, a second display substrate 220, which faces the first display substrate 210, and a liquid crystal layer (not shown) which is interposed between the first and second display substrates 210 and 220.

The first and second display substrates 210 and 220 can have substantially rectangular parallelepiped shapes. In FIG. 1, the first and second display substrates 210 and 220 are illustrated for ease of description to have rectangular parallelepiped shapes, but the shapes of the first and second display substrates 210 and 220 are not limited to the illustrated shapes and can vary according to the shape of the display panel 200.

The liquid crystal layer is interposed between the first and second display substrates 210 and 220. In addition, a sealing member such as a sealant can be placed along the periphery of the first and second display substrates 210 and 220 to bond the substrates 210 and 220 together.

Although not illustrated in FIG. 1, the display panel 200 may include a driver and a flexible circuit board which are attached to the first display substrate 210 and/or the second display substrate 220. The driver may transmit various signals (such as a driving signal) in order to display images in the display area. The flexible circuit board may transmit various signals to the driver.

The backlight assembly can be placed under the display panel 200. The backlight assembly provides light to the display panel 200. In the present specification, an edge-type backlight assembly in which a light source unit 500 is located on a side surface of a light guide plate (LGP) 600 will be described as an exemplary embodiment. However, the described technology is not limited thereto, and the described technology can also be embodied as a direct-type backlight assembly in which the light source unit 500 is located on a lower surface of a diffusion plate.

In the embodiment of FIG. 1, the backlight assembly includes the light source unit 500, the LGP 600, a wavelength conversion member 700, an optical sheet 400, a reflective plate 800, and a mold frame 300.

The light source unit 500 generates light and irradiates the generated light to the LGP 600. In the embodiment of FIG. 1, the light source unit 500 is placed on a side surface (i.e., an incident surface) of the LGP 600. In an exemplary embodiment, the light source unit 500 is placed so as to correspond to one long side of the LGP 600. However, the described technology is not limited thereto and the light source unit 500 can also be placed so as to correspond to one short side of the LGP 600.

The light source unit 500 can include a circuit board 510 and a plurality of light sources 520 formed on the circuit board 510.

The circuit board 510 can be placed on the incident surface of the LGP 600. The circuit board 510 is connected to a power source (not shown) and delivers electrical energy to the light sources 520. A surface of the circuit board 510 facing the incident surface of the LGP 600 may have a shape corresponding to the shape of the incident surface of the LGP 600. In an exemplary embodiment, the surface of the circuit board 510 is substantially parallel to the incident surface of the LGP 600. In addition, the area of the surface of the circuit board 510 can be substantially equal to the area of the incident surface of the LGP 600.

In some embodiments, the light sources 520 are arranged on the surface of the circuit board 510. The light sources 520 convert electrical energy received through the circuit board 510 into light energy. The light sources 520 can be arranged at regular intervals. In addition, the light sources 520 can be arranged in a row. The light sources 520 may be arranged so as to correspond to the shape of the incident surface of the LGP 600 which faces the light sources 520. In some embodiments, the light sources 520 are light-emitting diodes (LEDs). In addition, the light sources 520 may emit blue light. In an exemplary embodiment, the light sources 520 are blue LEDs that emit blue light, however, the described technology is not limited thereto.

In the exemplary embodiment of FIG. 1, the surface of the circuit board 510 which contacts the light sources 520 is substantially parallel to the incident surface. However, the described technology is not limited thereto and the surface of the circuit board 510 which contacts the light sources 520 may also be perpendicular to the incident surface. That is, the light source unit 500 may have a side-emitting structure. In these embodiments, a reflective layer is formed on the light sources 520 to guide light emitted from the light sources 520 toward the incident surface.

The LGP 600 can be located on a side of the light source unit 600. That is, in some embodiments, the LGP 600 lies in substantially the same plane as the light source unit 500. The LGP 600 guides light emitted from the light source unit 500 to the wavelength conversion member 700.

The LGP 600 may be formed of a transparent material. In an exemplary embodiment, the LGP 600 is formed of polymethyl methacrylate (PMMA). However, the material of the LGP 600 is not limited to PMMA and the LGP 600 can also be formed of various transparent materials that can guide light. In addition, the LGP 600 can be formed of a rigid material. However, the material of the LGP 600 is not limited to a rigid material and the LGP 600 can also be formed of a flexible material.

In some embodiments, the LGP 600 has a substantially rectangular parallelepiped plate shape. In the present specification, the LGP 600 having a substantially rectangular parallelepiped plate shape will be described as an exemplary embodiment. However, the shape of the LGP 600 is not limited to a rectangular parallelepiped plate and the LGP 600 can have various shapes.

The wavelength conversion member 700 can be interposed between the light source unit 500 and the LGP 600. However, the position of the wavelength conversion member 700 is not limited thereto and the wavelength conversion member 700 can also be interposed between the LGP 600 and the optical sheet 400.

The wavelength conversion member 700 converts the wavelength of light emitted from the light source unit 500 into a longer wavelength. In an exemplary embodiment, the wavelength conversion member 700 converts blue light emitted from the light source unit 500 into white light, but the described technology is not limited thereto.

The area of the wavelength conversion member 700 may be substantially equal to the area of the area of the circuit board 510 which faces the wavelength conversion member 700. In addition, the area of the wavelength conversion member 700 may be substantially equal to the area of the side surface of the LGP 600 which faces the wavelength conversion member 700. The wavelength conversion member 700 will be described in greater detail later.

The optical sheet 400 can be placed on the LGP 600. In some embodiments, the optical sheet 400 modulates the optical characteristics of light output from an exit surface or output surface of the LGP 600. A plurality of optical sheets 400 may be provided and the optical sheets 400 may be stacked on each other to overlap and complement each other. In an exemplary embodiment, the optical sheets 400 include at least one prism sheet or diffusion sheet.

The reflective plate 800 can be placed under the LGP 600. The reflective plate 800 changes the path of light emitted from the light source unit 500 and incident upon the reflective plate 800. The reflective plate 800 may be formed of a reflective material such as metal.

The mold frame 300 can be interposed between the display panel 200 and the optical sheets 400. In some embodiments, the mold frame 300 engages with the bottom chassis 900, thereby fixing in place the light source unit 500, the LGP 600, the wavelength conversion member 700, the optical sheets 400, and the reflective plate 800. In addition, the mold frame 300 can contact the periphery of the display panel 200, thereby supporting and fixing the display panel 200.

The top chassis 100 can cover the periphery of the display panel 200 and cover side surfaces of the display panel 200 and the backlight assembly. The bottom chassis 900 can house the backlight assembly. In some embodiments, the top chassis 100 and the bottom chassis 900 engage with each other to surround the display panel 200 and the backlight assembly. The top chassis 100 and the bottom chassis 900 may be formed of a conductive material such as metal.

Figure 2:
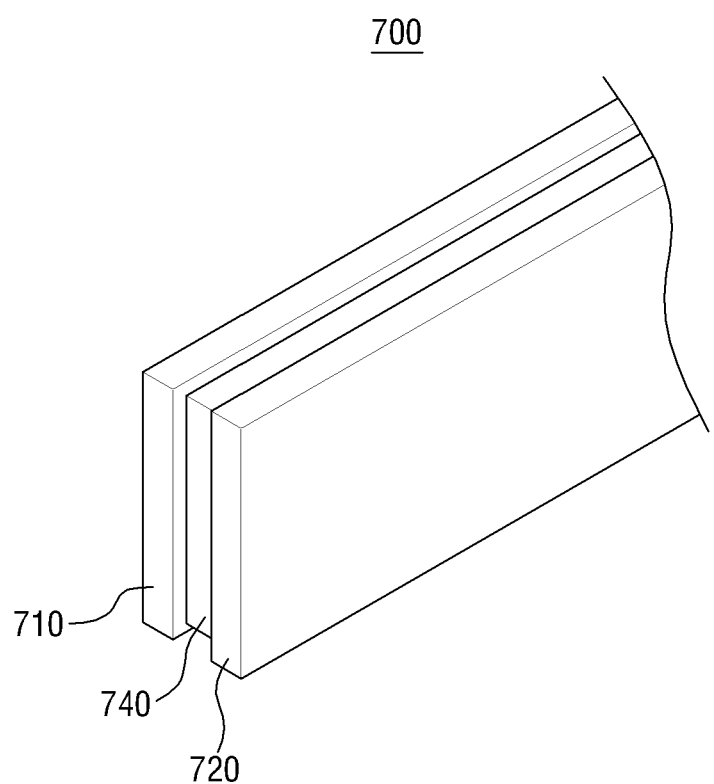
FIG. 2 is a perspective view of a wavelength conversion member of the display device of FIG. 1.
Figure 3:
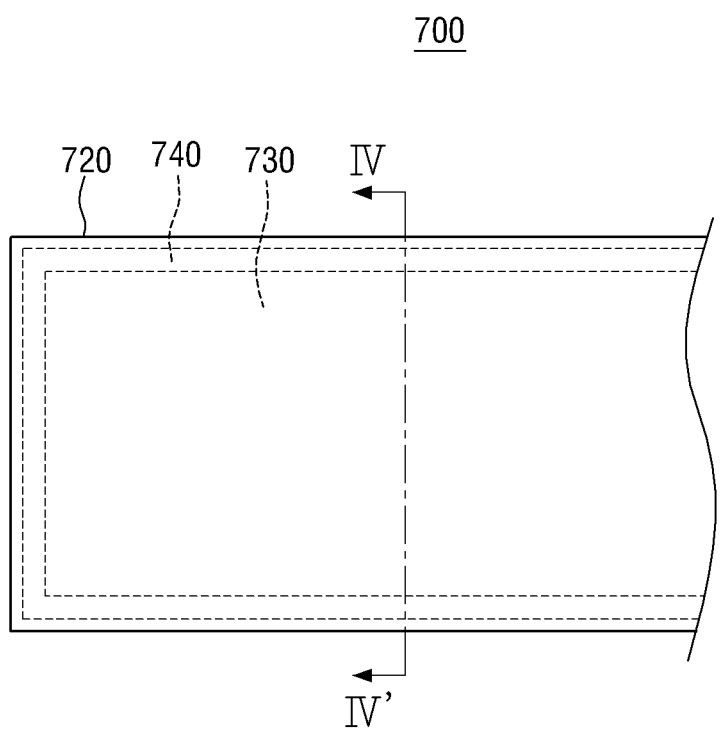
FIG. 3 is a front view of the wavelength conversion member of FIG. 2.
Figure 4:
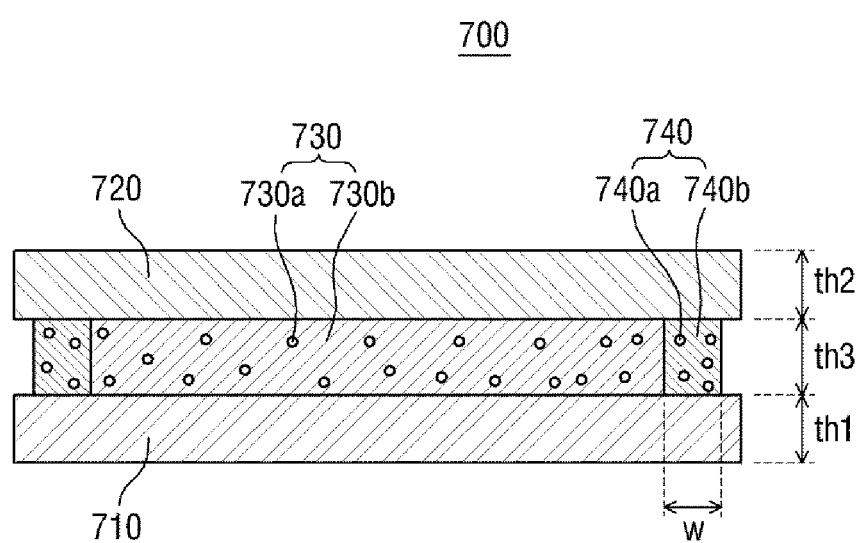
FIG. 4 is a cross-sectional view taken along the line IV-IV' of FIG. 3.

The wavelength conversion member 700 will now be described in greater detail with reference to FIGS. 2 through 4. FIG. 2 is a perspective view of the wavelength conversion member 700 of the display device of FIG. 1. FIG. 3 is a front view of the wavelength conversion member 700 of FIG. 2. FIG. 4 is a cross-sectional view taken along the line IV-IV' of FIG. 3. Referring to FIGS. 2 through 4, the wavelength conversion member 700 includes a first substrate 710, a second substrate 720, a wavelength conversion layer 730, and a sealant 740.

The first substrate 710 is formed under the wavelength conversion layer 730. As shown in the embodiment of FIGS. 2 to 4, the first substrate 710 directly contacts a lower surface of the wavelength converting layer 730. The first substrate 710 may be transparent. In addition, the first substrate 710 may be flexible. The first substrate 710 may has a substantially rectangular parallelepiped plate shape. However, the shape of the first substrate 710 is not limited to the rectangular parallelepiped plate shape and can vary according to the shape of the light source unit 500 or the LGP 600.

In some embodiments, the first substrate 710 has a thickness th1 of about 0.05 mm to about 1 mm. In an exemplary embodiment, the thickness th1 of the first substrate 710 is about 0.1 mm, but the described technology is not limited thereto. For example, depending on the embodiment, the thickness th1 of the first substrate 710 can be less than about 0.05 mm or greater than about 1 mm. As the thickness of the first substrate 710 decreases, the thickness of the wavelength conversion member 700 also decreases. Accordingly, the display device can be easily manufactured to have a narrow bezel.

The first substrate 710 may be formed of a material that can protect the wavelength conversion layer 730 from physical impact as well as from external moisture and oxygen. In an exemplary embodiment, the first substrate 710 is formed of an insulating material such as silicon oxide (SiOx), silicon nitride (SiNx), or a combination thereof. In another exemplary embodiment, the first substrate 710 is a plastic film such as polyethylene phthalate (PET) or polycarbonate (PC). In another exemplary embodiment, the first substrate 710 is formed of a glass material. In another exemplary embodiment, the first substrate 710 is formed of a polymer film.

The second substrate 720 is formed over the first substrate 710. In addition, the second substrate 720 is formed over the wavelength conversion layer 730. As shown in the embodiment of FIGS. 2 to 4, the second substrate 720 directly contacts an upper surface of the wavelength conversion layer 730. The second substrate 720 may be transparent. In addition, the second substrate 720 may be flexible. The second substrate 720 may have a substantially rectangular parallelepiped plate shape. However, the shape of the second substrate 720 is not limited to the rectangular parallelepiped plate shape and can vary according to the shape of the light source unit 500 or the LGP 600. In some embodiments, the shape of the second substrate 720 is substantially the same as the shape of the first substrate 710.

In some embodiments, the second substrate 720 has a thickness th2 of about 0.05 mm to about 1 mm. In an exemplary embodiment, the thickness th2 of the second substrate 720 is about 0.1 mm, but the described technology is not limited thereto. For example, depending on the embodiment, the thickness th2 of the second substrate 720 can be less than about 0.05 mm or greater than about 1 mm. In another exemplary embodiment, the thickness th2 of the second substrate 720 is substantially equal to the thickness th1 of the first substrate 710. As the thickness of the second substrate 720 decreases, the thickness of the wavelength conversion member 700 also decreases. Accordingly, the display device can easily be manufactured to have a narrow bezel.

The second substrate 720 may be formed of a material that can protect the wavelength conversion layer 730 from physical impact as well as from external moisture and oxygen. In an exemplary embodiment, the second substrate 720 is formed of an insulating material such as silicon oxide (SiOx), silicon nitride (SiNx), or a combination of the same. In another exemplary embodiment, the second substrate 720 is formed of a plastic film such as polyethylene phthalate (PET) or polycarbonate (PC). In another exemplary embodiment, the second substrate 720 is formed of a glass material. In another exemplary embodiment, the second substrate 720 is formed of a polymer film. In another exemplary embodiment, the second substrate 720 is formed of the same material as the first substrate 710.

The wavelength conversion layer 730 is interposed between the first and second substrates 710 and 720. Specifically, in the embodiment of FIG. 4, the wavelength conversion layer 730 is interposed between the respective middle portions of the first and second substrates 710 and 720. The wavelength conversion layer 730 converts the wavelength of light incident thereon.

The wavelength conversion layer 730 includes a plurality of quantum dots 730a and first resin 730b.

The quantum dots 730a are semiconductor nanoparticles having a core-shell structure and are several to tens of nm in size. The quantum dots 730a emit different light according to their particle size due to the quantum confinement of the particles. More specifically, the quantum dots 730a generate intense light in a narrow wavelength band and the light emission of the quantum dots 730a occurs when unstable (excited) electrons fall from a conduction band to a valence band. The quantum dots 730a tend to generate light having a shorter wavelength when their particle size is smaller and light having a longer wavelength when their particle size is larger. Therefore, light of all desired visible wavelengths can be generated by controlling the size of the quantum dots 730a.

Each of the quantum dots 730a may include any one nanocrystal selected from the group consisting of a Si nanocrystal, a group II-VI compound semiconductor nanocrystal, a group III-V compound semiconductor nanocrystal, a group IV-VI compound semiconductor nanocrystal, and a mixture or combination thereof.

The group II-VI compound semiconductor nanocrystal may be any one selected from the group of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HggZnTe, CdZnSeS, CdZnSeTe, CdZn-STe, CdHgSeS, CdHgSeTe, CdHgSTe, HgZnSeS, HgZnSeTe, and HgZnSTe.

The group III-V compound semiconductor nanocrystal may be any one selected from the group of GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs. The group IV-VI compound semiconductor nanocrystal may be SbTe.

The quantum dots 730a convert blue light incident thereon into red light and green light. Specifically, some of the quantum dots 730a, for example, quantum dots 730a having a diameter of approximately 3.8 nm, can convert a portion of the blue light into green light having a wavelength range of about 520 to about 560 nm. Other quantum dots 730a, for example, quantum dots 730a having a diameter of approximately 5.5 nm, can convert another portion of the blue light into red light having a wavelength range of about 630 nm to about 660 nm. In other embodiments, depending on the diameter of the quantum dots 730a, the wavelength of light emitted by the quantum dots 730a can be less than about 520 nm, between about 560 nm to about 630 nm, or greater than about 660 nm. Accordingly, the light that passes through the wavelength conversion layer 730 without being wavelength-converted and the light that is wavelength-converted by the wavelength conversion layer 730 is mixed together to form white light. That is, blue light, green light, and red light is combined to produce white light, which is then incident on the LGP 600.

The wavelength conversion layer 730 including the quantum dots 730a increases the color purity of the light that passes through the wavelength conversion layer 730. That is, when the wavelength conversion member 700 having the wavelength conversion layer 730 is applied to the backlight assembly, the color purity of the backlight assembly increases.

The first resin 730b is mixed with the quantum dots 730a. In some embodiment, the first resin 730b is a dispersive medium that disperses the quantum dots 730a. In an exemplary embodiment, the quantum dots 730a are dispersed in the first resin 730b so as to be substantially uniformly dispersed therein.

The first resin 730b may be formed of at least one of epoxy, silicone, polystyrene, acrylate, or a combination thereof. However, the first resin 730b is not limited to the above examples and can be any transparent medium that does not affect the wavelength conversion performance of the quantum dots 730a, does not reflect light, and does not cause optical absorption.

The wavelength conversion layer 730 may include an ultraviolet (UV) initiator, a thermosetting additive, a cross-linker, a dispersing agent, and/or a combination thereof, in addition to the quantum dots 730a and the first resin 730b. The wavelength conversion layer 730 including a mixture of the quantum dots 730a, the first resin 730b, and the above additives is formed on the first substrate 710.

The wavelength conversion layer 730 can have a thickness th3 of about 80 µm to about 100 µm. When the wavelength conversion layer 730 has a thickness th3 of 80 µm or less, it may be unable to fully wavelength-convert incident blue light into white light. That is, light that passes through the wavelength conversion layer 730 having a thickness th3 of about 80 µm or less may become bluish. On the other hand, when the wavelength conversion layer 730 has a thickness th3 of about 100 µm or greater, it may excessively wavelength-convert the incident blue light. That is, light that passes through the wavelength conversion layer 730 having a thickness th3 of 100 µm or greater may become yellowish. However, depending on the embodiment, the thickness th3 of the wavelength conversion layer 730 can be less than about 80 µm or greater than about 100 µm.

The sealant 740 is interposed between the first substrate 710 and the second substrate 720 and surrounds the wavelength conversion layer 730. Accordingly, the wavelength conversion layer 730 can be completely sealed by the first substrate 710, the second substrate 720, and the sealant 740.

In some embodiments, the sealant 740 includes a plurality of fine particles 740a and second resin 740b.

The fine particles 740a may be formed of substantially the same material as the first substrate 710 or the second substrate 720. In an exemplary embodiment, the first substrate 710 and the second substrate 720 are formed of a glass material and the fine particles 740a are a glass powder. In another exemplary embodiment, the first substrate 710 and the second substrate 720 are formed of a polymer and the fine particles 740a are also be formed of a polymer.

In some embodiments, the fine particles 740a adjacent to the first and second substrates 710 and 720 respectively directly contact the first and second substrates 710 and 720. In an exemplary embodiment, the fine particles 740a adjacent to the first and second substrates 710 and 720 are respectively integrally formed on the first and second substrates 710 and 720.

In some embodiments, the fine particles 740a are separated from each other. However, the described technology is not limited thereto, and in other embodiments, the fine particles 740a are connected to form a mesh structure. In these embodiments, the fine particles 740a maintain a gap between the first and second substrates 710 and 720 and substantially prevent the transmission of physical impacts to the wavelength conversion layer 730 and the introduction of moisture and oxygen into the wavelength conversion layer 730.

In some embodiments, the second resin 740b is mixed with the fine particles 740a. That is, the second resin 740b can be mixed with the fine particles 740a to form a paste. In an exemplary embodiment, the second resin 740b is formed of at least one of epoxy, silicone, polystyrene, and acrylate.

In another exemplary embodiment, the second resin 740b is formed of substantially the same material as the first resin 730b.

In some embodiments, the molecular weight of the second resin 740b is higher than that of the first resin 730b. That is, in these embodiments, the ability of the second resin 740b to fix the first and second substrates 710 and 720 together is more important than its dispersive ability, in contrast to the first resin 730b. Therefore, the molecular weight of the second resin 740b can be selected such that the sealant 740 is stably fixed between the first and second substrates 710 and 720.

As described above, the sealant 740 may be a mixture of the fine particles 740a and the second resin 740b. However, the described technology is not limited thereto, and the sealant 740 may also be a single material such as a glass frit.

In some embodiments, the sealant 740 has a width w of about 0.05 mm to about 0.3 mm. For example, the width w of the sealant 740 can be about 0.1 mm to about 0.2 mm. In some embodiments, the width w of the sealant 740 is about 0.1 mm. However, depending on the embodiment, the width of the sealant may be less than about 0.05 mm or greater than about 0.3 mm. When the width w of the sealant 740 decreases, as described above, the width of the wavelength conversion layer 730 increases. The increase in the width of the wavelength conversion layer 730 can further strengthen the wavelength conversion functionality of the wavelength conversion layer 730. In addition, when the width w of the sealant 740 is below a threshold, even if the area of the wavelength conversion member 700 is substantially equal to the area of the incident surface of the LGP 600, the wavelength conversion layer 730 can fully cover emission surfaces of the light sources 520. That is, the area of the wavelength conversion member 700 can be formed to be substantially equal to the area of the incident surface of the LGP 600, thereby realizing a thin profile display device.

Figure 5:
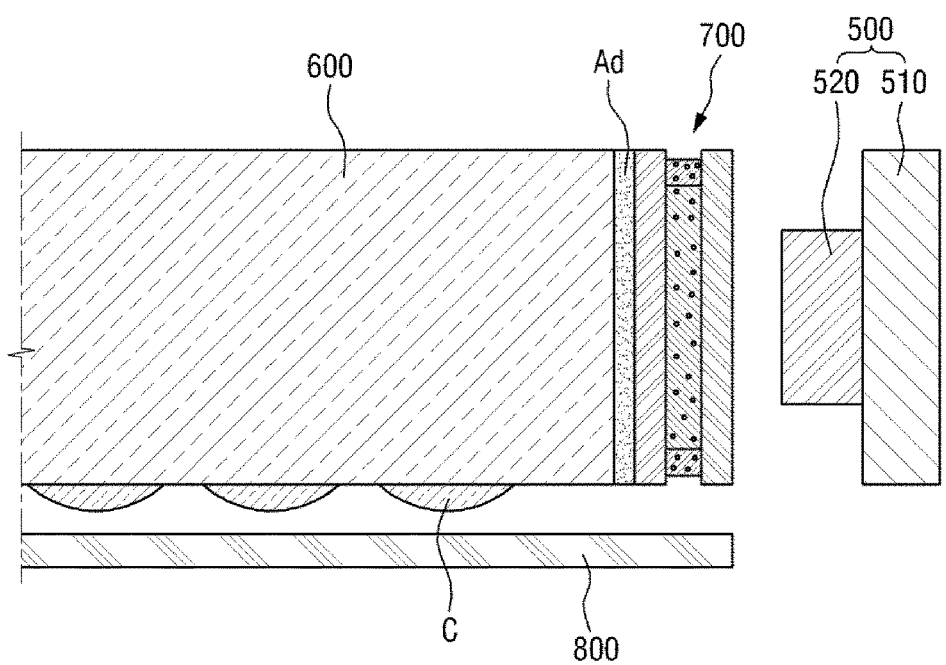
FIG. 5 is a cross-sectional view taken along the line V-V' of FIG. 1.

The backlight assembly according to an embodiment will now be described in greater detail with reference to FIG. 5. FIG. 5 is a cross-sectional view taken along the line V-V' of FIG. 1.

Referring to FIG. 5, the wavelength conversion member 700 is fixed to the LGP 600 by an adhesive Ad. Specifically, the adhesive Ad is interposed between the LGP 600 and the wavelength conversion member 700 to stably fix the wavelength conversion member 700 to a side surface of the LGP 600.

The adhesive Ad may be at least one of a thermosetting adhesive, a catalyst containing adhesive, a moisture cure adhesive, an anaerobic adhesive, a hot melt adhesive, an optically clear adhesive (OCA), and a pressure-sensitive adhesive. In an exemplary embodiment, the adhesive Ad is an OCA. Here, the OCA may be transparent and semi-solid. Generally, a semi-solid material can be easily fixed in shape. Therefore, it is easier to deal with a semi-solid material than a liquid resin. In another exemplary embodiment, the adhesive strength of the adhesive Ad can be adjusted to enable the adhesive Ad to be easily attached to or detached from a target object.

In the embodiment of FIG. 5, the LGP 600 includes a plurality of convex portions C on a lower surface thereof. The convex portions C strengthen the light guiding function of the LGP 600. That is, the convex portions can aid in transmitting the light emitted from the light source unit 500 to an opposite surface of the LGP 600 which faces the incident surface by the convex portions C.

A method of manufacturing a wavelength conversion member according to an embodiment will now be described with reference to FIGS. 6 through 10. FIGS. 6 through 10 are perspective views illustrating steps of a method of manufacturing the wavelength conversion member 700 of FIG. 2.

Figure 6:
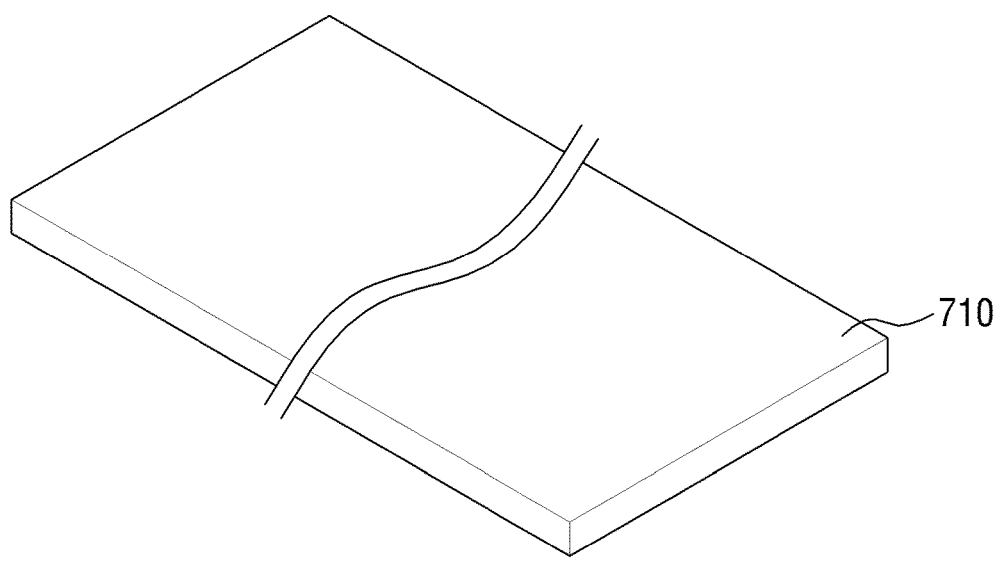
FIGS. 6 through 10 are perspective views illustrating steps of a method of manufacturing the wavelength conversion member of FIG. 2.

Referring to FIG. 6, a first substrate 710 is prepared.

Figure 7:
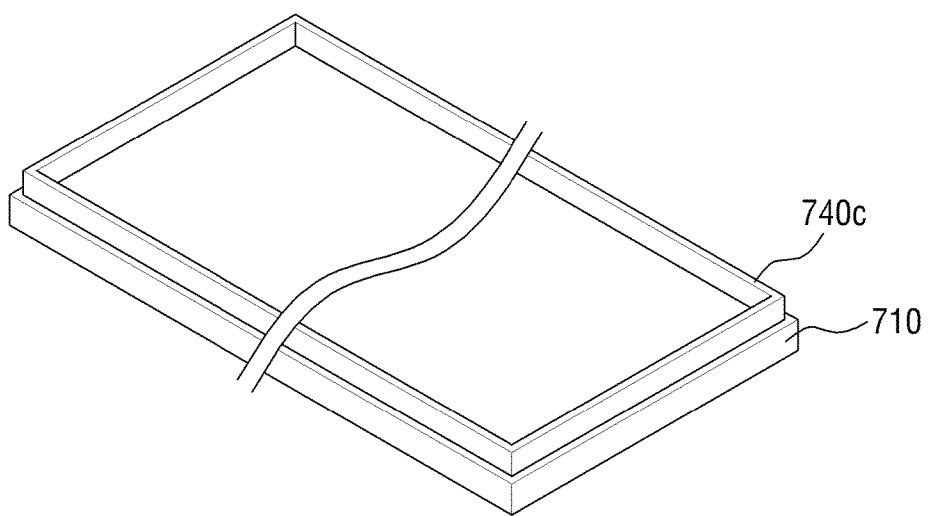

Referring to FIG. 7, a bank 740c is formed along the edges of the first substrate 710. The bank 740c may be an element that later becomes the sealant 740. That is, as will be described later, the bank 740c may be a structure prior to being sintered into the sealant 740. Accordingly, the bank 740c may be formed of substantially the same material as the sealant 740.

The bank 740c may be formed by a printing or coating process. In an exemplary embodiment, the bank 740c is formed by a silk screen printing process, but the described technology is not limited thereto.

Figure 8:
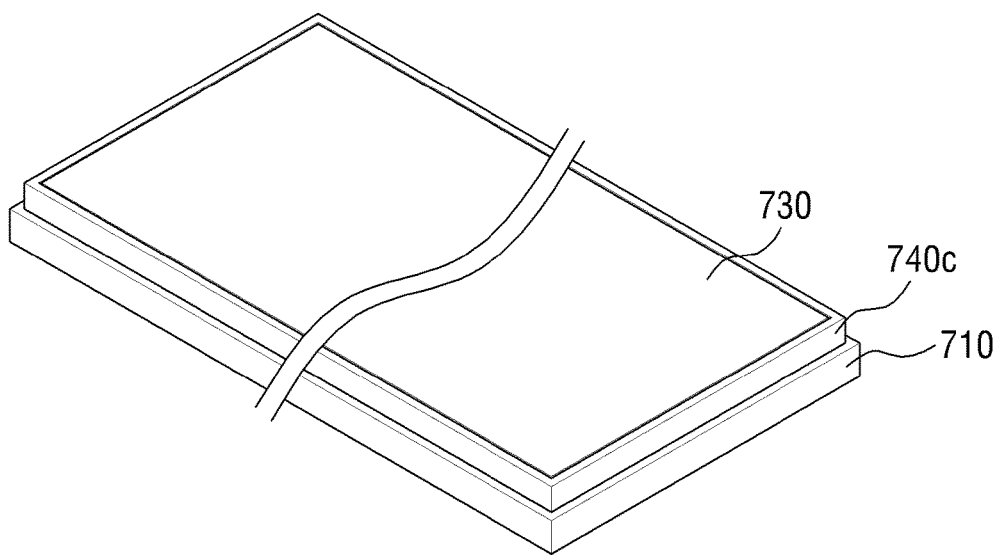

Referring to FIG. 8, a wavelength conversion layer 730 is formed on the first substrate 710 surrounded by the bank 740c. Like the bank 740c, the wavelength conversion layer 730 may be formed by a printing or coating process. In an exemplary embodiment, the bank 730 is formed by a silk screen printing process, but the described technology is not limited thereto.

Figure 9:
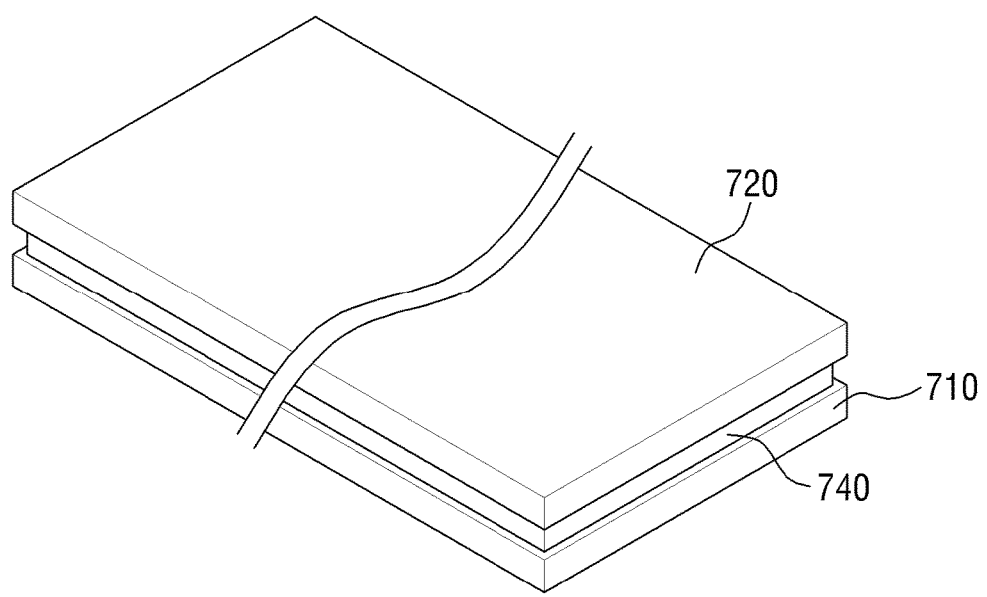

Referring to FIG. 9, a second substrate 720 is placed on the wavelength conversion layer 730 and the bank 740c. Here, the second substrate 720 may be placed to completely overlap the first substrate 710.

Figure 10:
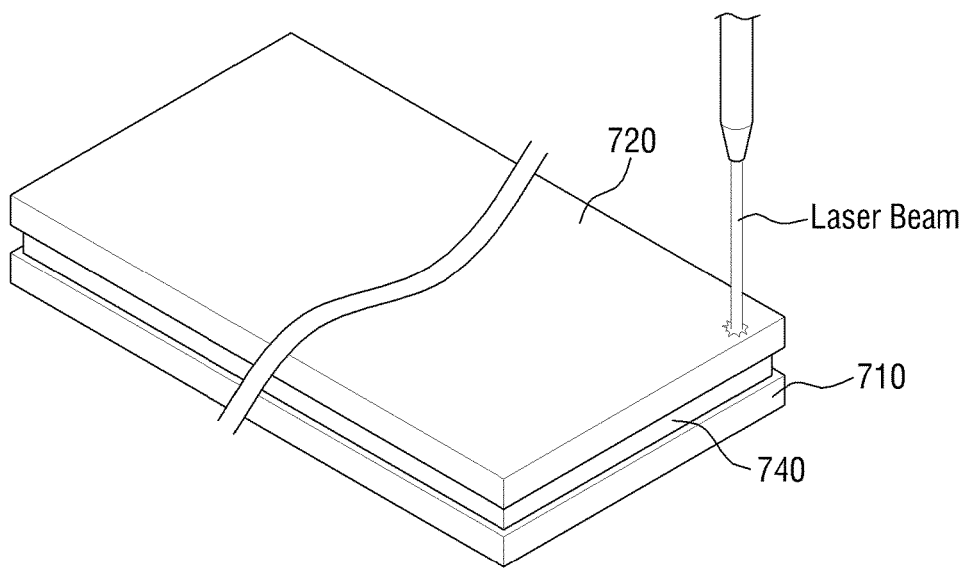

Referring to FIG. 10, the bank 740c is sintered. Specifically, the bank 740c is sintered into the sealant 740 by irradiating a laser beam onto the bank 740c. In an exemplary embodiment, the thermal energy of the laser beam is transmitted to the bank 740c, thereby melting the bank 740c. Here, since the thermal energy is transmitted only to a portion of the bank 740c, the wavelength conversion layer 730 is not degraded. As the bank 740c melts, it is integrated onto the first substrate 710 and the second substrate 720, thereby forming the sealant 740. Through this process, the wavelength conversion layer 730 can be completely sealed by the first substrate 710, the second substrate 720, and the sealant 740.

The method of manufacturing the wavelength conversion member 700 according to the current embodiment may include very simple processes. That is, the first substrate 710, the bank 740c, the wavelength conversion layer 730, and the second substrate 720 are placed sequentially, and then the bank 740c is converted into the sealant 740. Through these simple processes, the wavelength conversion member 700 having a thin profile can be easily manufactured. Accordingly, the cost and time required to manufacture the wavelength conversion member 700 can be reduced.

Figure 11:
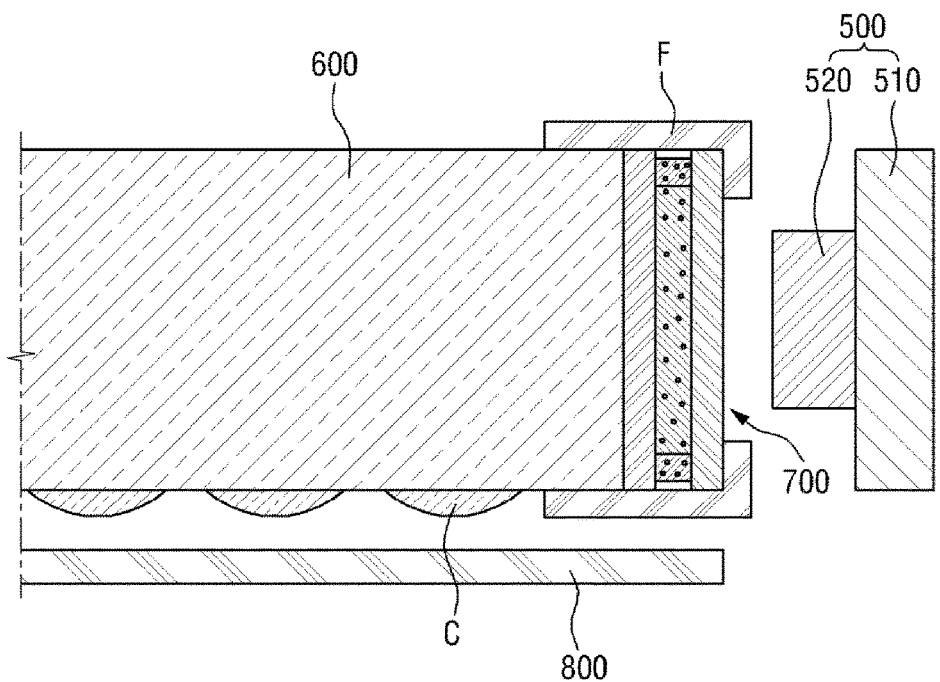
FIG. 11 is a cross-sectional view of a backlight assembly according to another embodiment.

FIG. 11 is a cross-sectional view of a backlight assembly according to another embodiment. For simplicity, elements substantially identical to those illustrated in the above-described drawings are indicated by like reference numerals, and thus redundant descriptions thereof will be omitted.

Referring to FIG. 11, a wavelength conversion member 700 is fixed to an LGP 600 by a fixing device F.

In some embodiments, the fixing device F includes two sub fixing devices which face each other. One of the two sub fixing devices partially covers an upper surface of the LGP 600, a side surface of the wavelength conversion member 700, and a surface of the wavelength conversion member 700 which is connected to the side surface of the wavelength conversion member 700. In addition, the other one of the two sub fixing devices partially covers a lower surface of the LGP 600, a side surface of the wavelength conversion member 700, and a surface of the wavelength conversion member 700 which is connected to the side surface of the wavelength conversion member 700. The fixing device F may be formed of a rigid material such as metal or plastic.

Figure 12:
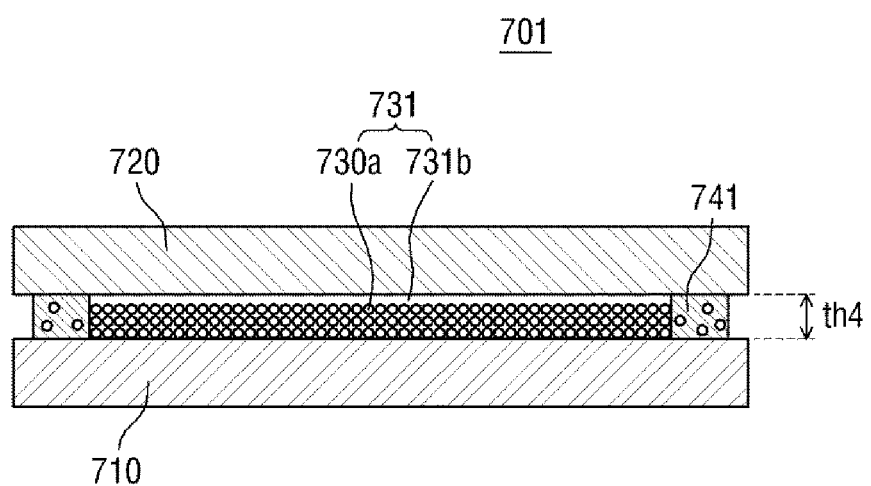
FIGS. 12 through 14 are cross-sectional views of wavelength conversion members according to other embodiments.
Figure 13:
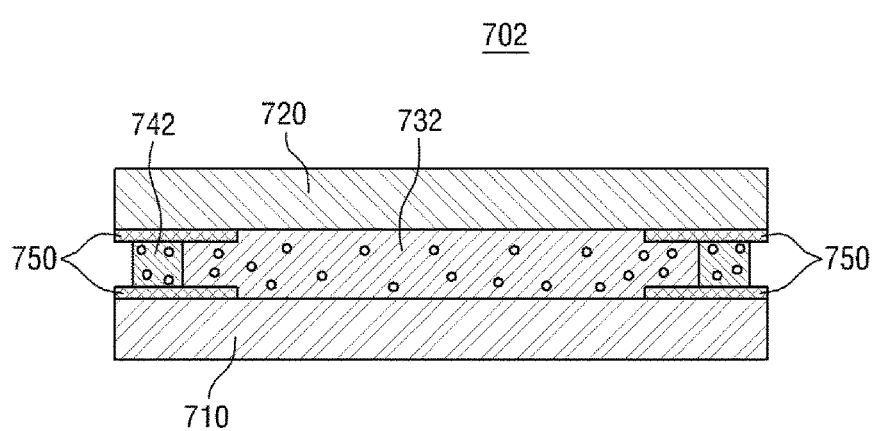
Figure 14:
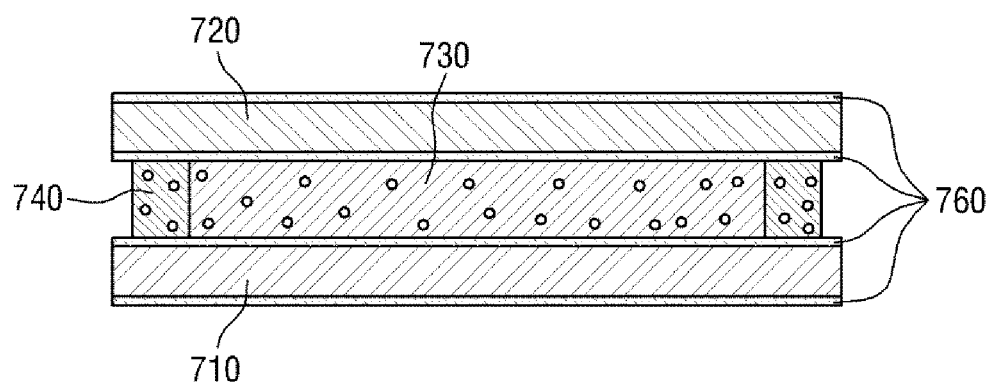

FIGS. 12 through 14 are cross-sectional views of wavelength conversion members 701 through 703 according to other embodiments. For simplicity, elements substantially identical to those illustrated in the above-described drawings are indicated by like reference numerals, and thus redundant descriptions thereof will be omitted.

Referring to FIG. 12, a wavelength conversion layer 731 of the wavelength conversion member 701 is in a powder form, not in a paste form in which quantum dots 703a and resin are mixed. That is, the wavelength conversion layer 731 of this embodiment does not include resin in which the quantum dots 730a are dispersed.

When the quantum dots 730a are in a powder form, the density thereof in the wavelength conversion layer 731 is increased, thereby further reducing the thickness th4 of the wavelength conversion layer 731. In an exemplary embodiment, the thickness th4 of the wavelength conversion layer 731 is about 10 μm to about 20 μm. The wavelength conversion layer 731 having a thickness th4 of about 10 μm or less may be unable to fully wavelength-convert incident blue light into white light. That is, light that passes through the wavelength conversion layer 731 having a thickness th4 of about 10 μm or less may become bluish. On the other hand, the wavelength conversion layer 731 having a thickness th4 of about 20 μm or greater may excessively wavelength-convert incident blue light. That is, light that passes through the wavelength conversion layer 731 having a thickness th4 of about 20 μm or greater may become yellowish. However, depending on the embodiment, the thickness th4 of the wavelength conversion layer 731 can be less than about 10 μm or greater than about 20 μm.

In the embodiment of FIG. 12, the wavelength conversion layer 731 includes an inert gas 731b in addition to the quantum dots 730a. The inert gas 731b is mixed with the quantum dots 730a. That is, the inert gas 731b fills the space between the quantum dots 730a. Since the inert gas 731b does not chemically react with the quantum dots 730a, it can stably maintain the quantum dots 730a.

As the thickness th4 of the wavelength conversion layer 731 decreases, the thickness of the sealant 741 also decreases based on the thickness th4 of the wavelength conversion layer 731.

Referring to FIG. 13, the wavelength conversion member 702 further includes a light blocking layer 750 located on edges of at least one of the first and second substrates 710 and 720. In an exemplary embodiment, the light blocking layer 750 is formed on all edges of the first substrate 710 which face the wavelength conversion layer 732 and the sealant 742 and on all edges of the second substrate 720 which face the wavelength conversion layer 732 and the sealant 742. However, the described technology is not limited thereto and the light blocking layer 750 may also be formed on only a portion of the edges. Since the light blocking layer 750 is formed between the first and second substrates 710 and 720 as described above, the thicknesses of the wavelength conversion layer 732 and the sealant 742 may be partially changed.

The light blocking layer 750 may be formed of a light blocking material. In an exemplary embodiment, the light blocking layer 750 may be formed of the same material as a black matrix included in a display panel 200, but the described technology is not limited thereto.

The light blocking layer 750 placed on the edges of the first and second substrates 710 and 720 ensures that light emitted from the light source unit 500 is incident only on the wavelength conversion layer 732.

Referring to FIG. 14, the wavelength conversion member 703 may further include an optical coating layer 760 located on at least one of the first and second substrates 710 and 720. In an exemplary embodiment, the optical coating layer 760 is formed on upper and lower surfaces of each of the first and second substrates 710 and 720. However, the described technology is not limited thereto, and the optical coating layer 760 may also be formed on a portion of the upper and lower surfaces of the first and second substrates 710 and 720.

The optical coating layer 760 may include at least one of a reflection preventing layer and a light transmission adjusting layer. The reflection preventing layer may prevent diffused reflection of light incident on the wavelength conversion member 703, thereby increasing the wavelength conversion efficiency of the wavelength conversion member 703. In addition, the light transmission adjusting layer may finely adjust the color of light that passes through the wavelength conversion layer 730 by adjusting the amount of light incident on the wavelength conversion layer 730.

Figure 15:
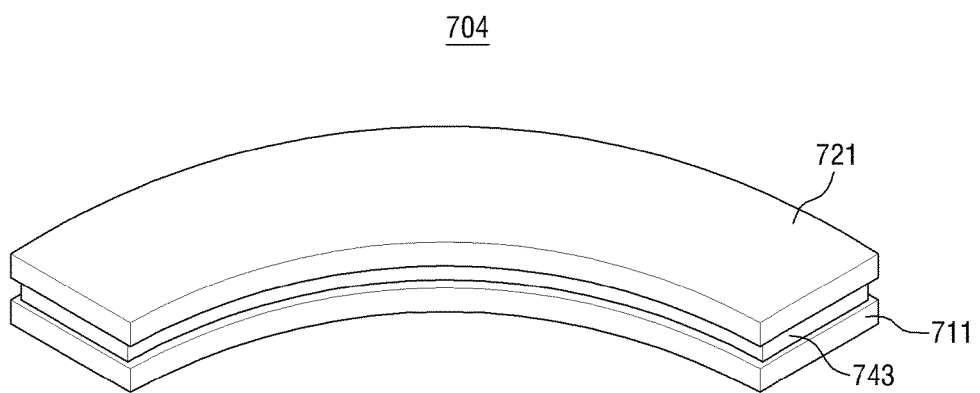
FIG. 15 is a perspective view of a wavelength conversion member according to another embodiment.
Figure 16:
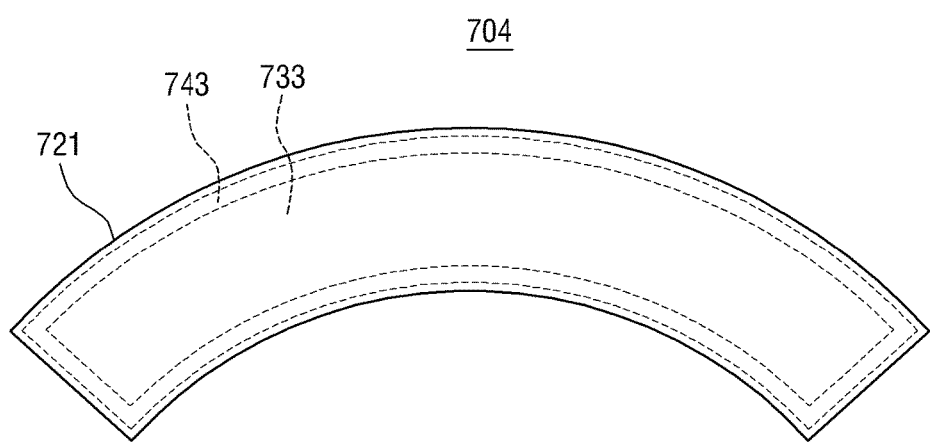
FIG. 16 is a plan view of the wavelength conversion member of FIG. 15.

FIG. 15 is a perspective view of a wavelength conversion member 704 according to another embodiment. FIG. 16 is a plan view of the wavelength conversion member 704 of FIG. 15. For simplicity, elements substantially identical to those illustrated in the above-described drawings are indicated by like reference numerals, and thus redundant descriptions thereof will be omitted.

Referring to FIGS. 15 and 16, the wavelength conversion member 704 has a curved structure. For example, the wavelength conversion member 704 may be substantially parabolic. In some embodiments, the surface of the first substrate 711 which faces the second substrate 721 includes a curved side. Thus, the first substrate 711 has a substantially C-shape. In addition, the shape of the second substrate 721 corresponds to the shape of the first substrate 711. Also, the shape of the wavelength conversion layer 733 and the shape of a sealant 743 interposed between the first and second substrates 711 and 721 each correspond to the shape of the first and second substrates 711 and 721.

Since the wavelength conversion member 704 according to the current embodiment can be manufactured very simply, wavelength conversion members of various shapes can be manufactured easily. That is, not only can the wavelength conversion member 704 be manufacture to have a curved structure, but also, for example, a square, oval, or polygonal structure.

Figure 17:
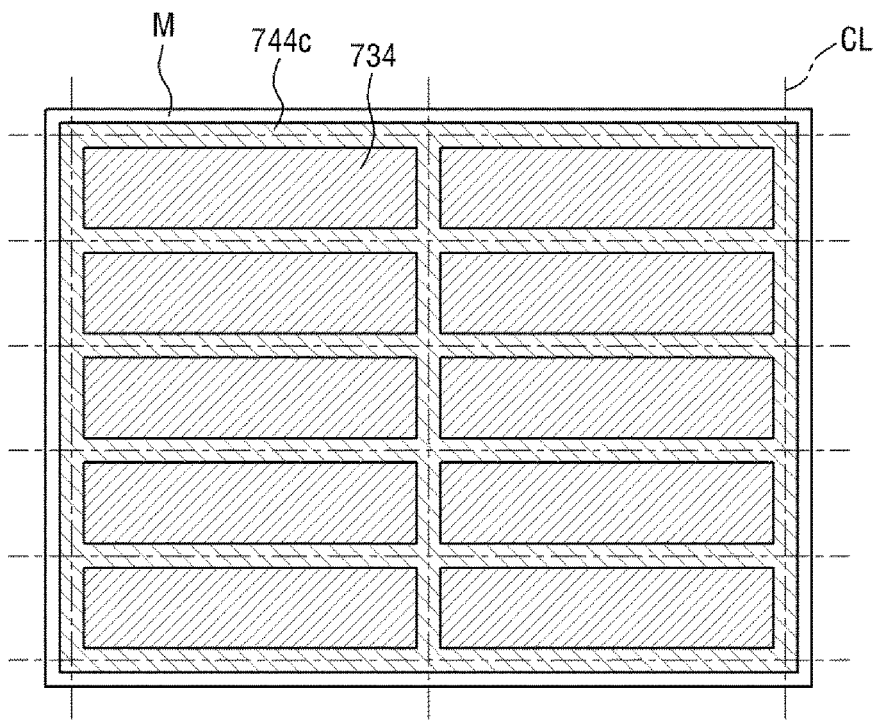
FIG. 17 is a plan view illustrating a method of manufacturing a wavelength conversion member according to another embodiment.

FIG. 17 is a plan view illustrating a method of manufacturing a wavelength conversion member 700 according to another embodiment. Here, the wavelength conversion member 700 is substantially identical to the wavelength conversion member 700 of FIG. 2. For simplicity, elements substantially identical to those illustrated in the above-described drawings are indicated by like reference numerals, and thus redundant descriptions thereof will be omitted.

Referring to FIG. 17, the manufacturing of the wavelength conversion member 700 according to the current embodiment includes forming the necessary structures on a mother substrate and cutting the mother substrate. Specifically, a latticed bank 744c is coated on a lower mother substrate M, and then the regions defined by the bank 744c are coated with a wavelength conversion layer 734. Thereafter, an upper mother substrate (not shown) is placed on the wavelength conversion layer 734 and the bank 744c. The bank 744c is then sintered. Finally, the resultant structure is cut along cutting lines CL into a plurality of wavelength conversion members 700.

In the method of manufacturing the wavelength conversion member 700 according to the current embodiment, a plurality of wavelength conversion members 700 can be easily mass-produced at a low cost.

Figure 18:
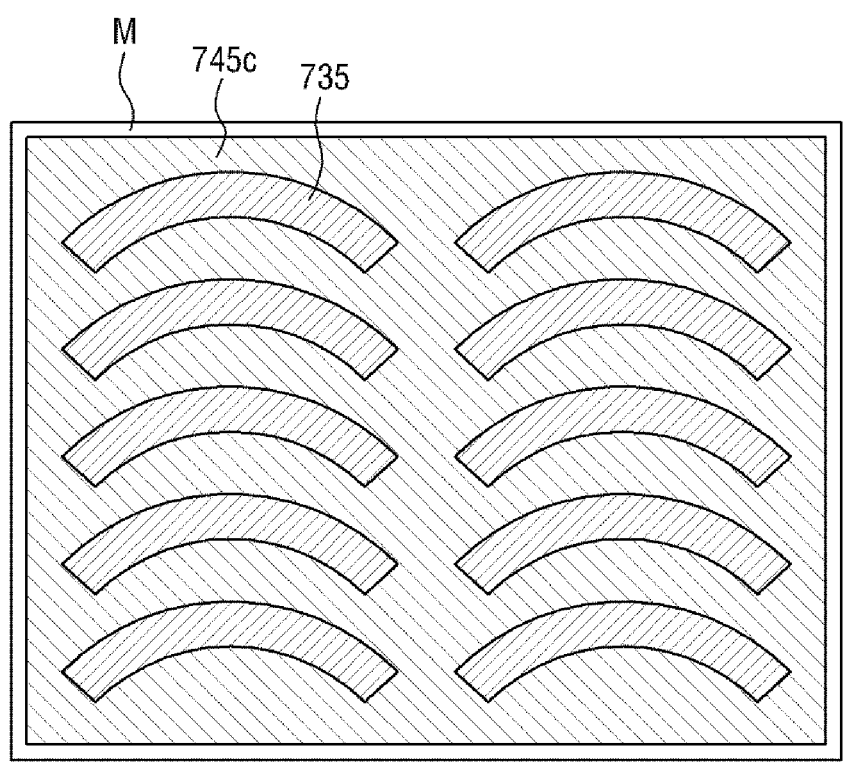
FIG. 18 is a plan view illustrating a method of manufacturing a wavelength conversion member according to another embodiment.

FIG. 18 is a plan view illustrating a method of manufacturing a wavelength conversion member 704 according to another embodiment. Here, the wavelength conversion member 704 is substantially identical to the wavelength conversion member 704 of FIG. 15. For simplicity, elements substantially identical to those illustrated in the above-described drawings are indicated by like reference numerals, and thus redundant descriptions thereof will be omitted.

Referring to FIG. 18, curved wavelength conversion members 704 can be mass-produced. That is, a bank 745c is coated on a region of a lower mother substrate M, excluding a plurality of parabolic regions. Then, a wavelength conversion layer 735 is coated on the parabolic regions defined by the bank 745c. Thereafter, an upper mother substrate (not shown) is placed on the wavelength conversion layer 735 and the bank 745c. The bank 745c is then sintered. Finally, the resultant structure is cut along cutting lines (not shown) into a plurality of curved wavelength conversion members 704.

Embodiments of the described technology provide at least one of the following advantages.

A thin wavelength conversion member can be obtained using a simple process.

In addition, wavelength conversion members can be mass-produced at low costs.

Further, the color purity of a backlight assembly can be increased.

Lastly, a thin display device having a narrow bezel can be obtained.

However, the effects of the described technology are not restricted to the one set forth herein. The above and other effects of the described technology will become more apparent to one of ordinary skill in the art to which the described technology pertains by referencing the appended claims.

While the inventive technology has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A method of manufacturing a wavelength conversion member for a display device, the method comprising:
   providing a first substrate;
   forming a wavelength conversion layer and a bank over the first substrate, wherein the bank surrounds the wavelength conversion layer;
   placing a second substrate over the wavelength conversion layer and the bank; and
   sintering the bank after the forming of the wavelength conversion layer,
   wherein the wavelength conversion layer comprises a plurality of quantum dots, and
   wherein the wavelength conversion layer further comprises an inert gas filling a space between the quantum dots and dispersed in the wavelength conversion layer.

2. The method of claim 1, wherein the forming comprises: forming the bank along edges of the first substrate; and forming the wavelength conversion layer on a region of the first substrate defined by the bank.

3. The method of claim 2, wherein the wavelength conversion layer and the bank are formed by a printing process or a coating process.

4. The method of claim 1, wherein the sintering comprises irradiating a laser beam onto the bank.

5. The method of claim 1, wherein the wavelength conversion layer directly contacts the first substrate or the second substrate.

6. The method of claim 1, wherein the wavelength conversion layer has a thickness of about 10 μm to about 20 μm.

7. The method of claim 1, wherein the wavelength conversion layer further comprises a first resin with the quantum dots dispersed therein.

8. The method of claim 7, wherein the wavelength conversion layer has a thickness of about 80 μm to about 100 μm.

9. The method of claim 1, wherein the bank comprises a mixture of fine particles and a second resin.

10. The method of claim 9, wherein the fine particles are formed of the same material as at least one of the first and second substrates.

11. The method of claim 1, further comprising forming a light blocking layer along edges of at least one of the first and second substrates.

12. The method of claim 1, further comprising forming a reflection preventing layer or a light transmission adjusting layer on at least one of the first substrate and second substrates.

13. The method of claim 1, wherein each of the first and second substrates has a substantially C-shape.

* * * * *